United States Patent
Li

(10) Patent No.: US 7,742,312 B2
(45) Date of Patent: Jun. 22, 2010

(54) ELECTRONIC DEVICE AND METHOD OF FABRICATION OF A SAME

(75) Inventor: Te-Wei Li, Taipei County (TW)

(73) Assignee: Lite-On Technology Corporation, Taipei (TW)

( * ) Notice: Subject to any disclaimer, the term of this patent is extended or adjusted under 35 U.S.C. 154(b) by 280 days.

(21) Appl. No.: 11/773,279

(22) Filed: Jul. 3, 2007

(65) Prior Publication Data

US 2008/0008890 A1  Jan. 10, 2008

(30) Foreign Application Priority Data

Jul. 4, 2006  (TW) .............................. 95124298 A

(51) Int. Cl.
*H05K 7/00* (2006.01)
(52) U.S. Cl. ........................ 361/777; 361/760
(58) Field of Classification Search .............. 361/777, 361/760, 740; 174/258, 260; 29/846, 830; 257/774
See application file for complete search history.

(56) References Cited

U.S. PATENT DOCUMENTS

| | | | |
|---|---|---|---|
| 6,000,128 A * | 12/1999 | Umeno et al. .................. 29/846 |
| 6,421,013 B1 * | 7/2002 | Chung ................. 343/700 MS |
| 7,106,599 B2 * | 9/2006 | Azdasht ...................... 361/783 |
| 7,446,711 B2 * | 11/2008 | Jow et al. .............. 343/700 MS |
| 2003/0141096 A1 * | 7/2003 | Saccomanno ............... 174/100 |

* cited by examiner

*Primary Examiner*—Jeremy C Norris
*Assistant Examiner*—Yuriy Semenenko
(74) *Attorney, Agent, or Firm*—Quintero Law Office

(57) ABSTRACT

An electronic device and method of fabrication are provided. The electronic device comprises a substrate, a patterned conductive layer serving as an antenna layer formed on the outer surface of the substrate, electrically connected with a printed circuit board (PCB) for sending or receiving a wireless signal, wherein the substrate is placed between the patterned conductive layer and PCB. The patterned conductive layer may be electrically connected to the PCB through a hole in the substrate by a connecting piece. The substrate may be a housing of the electronic device.

8 Claims, 16 Drawing Sheets

ELECTRONIC DEVICE AND METHOD OF FABRICATION OF A SAME

BACKGROUND OF THE INVENTION

1. Field of the Invention

The invention relates to electronic devices, and in particular to an electronic device having a patterned conductive layer serving as antenna layer.

2. Description of the Related Art

Antennas for radio devices convert electrical signals to electromagnetic signals or vice versa. In handheld electronic devices, the antenna can be external or internal. FIGS. 1 to 4 show antennas of conventional electronic devices.

As shown in FIG. 1, an external antenna 51 is disposed on an antenna carrier 52, protruding from a housing 53 of an electronic device. FIG. 2 shows a conventional internal antenna 61 produced by punched metal, disposed on an antenna carrier 62, and installed in an electronic device. FIG. 3 shows an antenna component 71 produced by forming an antenna layer on soft circuit board, disposed on an antenna carrier 72, and then installed in an electronic device 73. FIG. 4 shows an antenna 81 produced by folding metal and disposed on an antenna carrier 82, installed in an electronic device. Conventional manufactured by punching or folding and assembly with a plastic antenna carrier adversely affects manufacture and assembly costs and limits size and space conservation.

BRIEF SUMMARY OF INVENTION

Accordingly, the invention provides an electronic device having a patterned conductive layer serving as an antenna layer.

The electronic device comprises a substrate, a patterned conductive layer formed on an outer surface of the substrate and electrically connected to a control circuit to send or receive a wireless signal, wherein the substrate is between the patterned conductive layer and the control circuit.

The electronic device further comprises a connective piece with the substrate having a hole therethrough, and the patterned conductive layer electrically connects to the control circuit by the connective piece passing through the hole.

The patterned conductive layer is directly formed on the substrate, serving as an antenna layer to send or receive wireless signals, such that an antenna carrier is not necessary. Accordingly, the electronic device of the invention provides an advantage of reduced thickness of 1.2 mm to 1.5 mm compared to conventional electronic devices with the same antenna height.

Further provided is an electronic device having multi-patterned conductive layers serving as antenna layers to send or receive wireless signals, such as various wavelength or frequency. The multi-patterned conductive layers of the electronic device are formed sequentially in stacked layers, reducing cost and increasing space utilization of electronic device.

Also provides is a method of fabricating an electronic device having a patterned conductive layer serving as an antenna layer. The method includes providing a substrate, forming a patterned conductive layer on the substrate, and providing a connective piece to electrically connect the patterned conductive layer and a control circuit.

The method further includes forming a precise patterned conductive layer by laser carving, increasing inner space utilization of the electronic device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
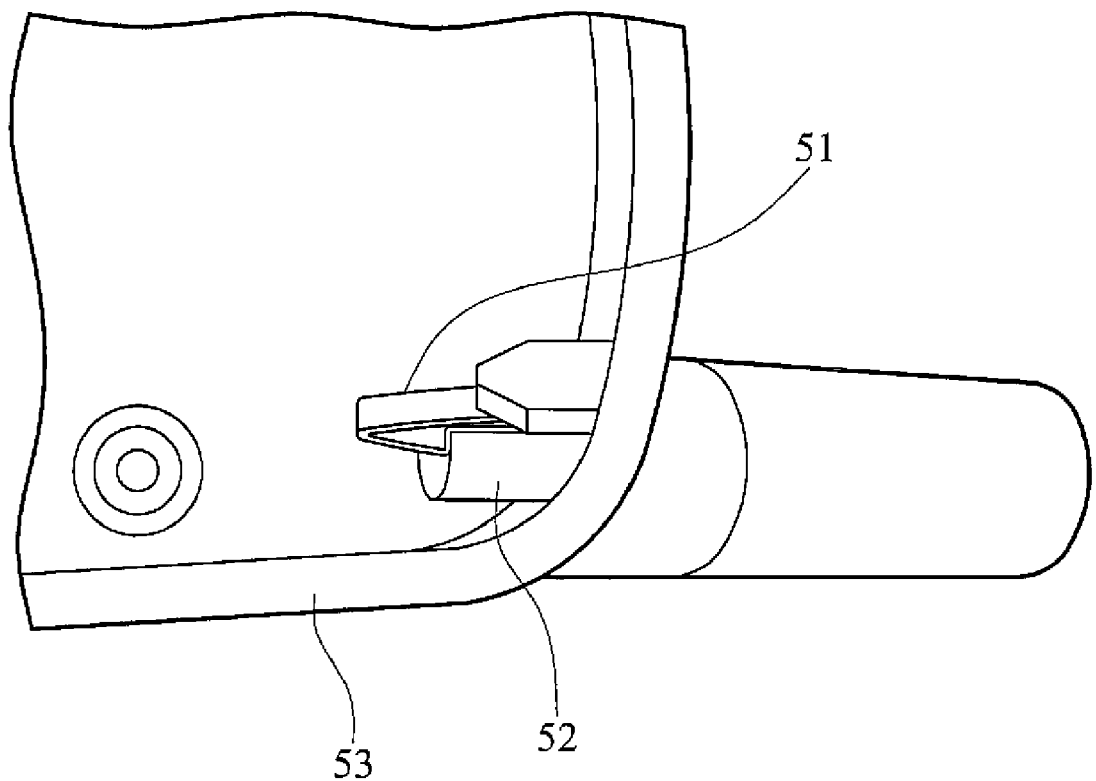
FIGS. 1-4 are schematic views showing antennas of conventional electronic devices.
Figure 2:
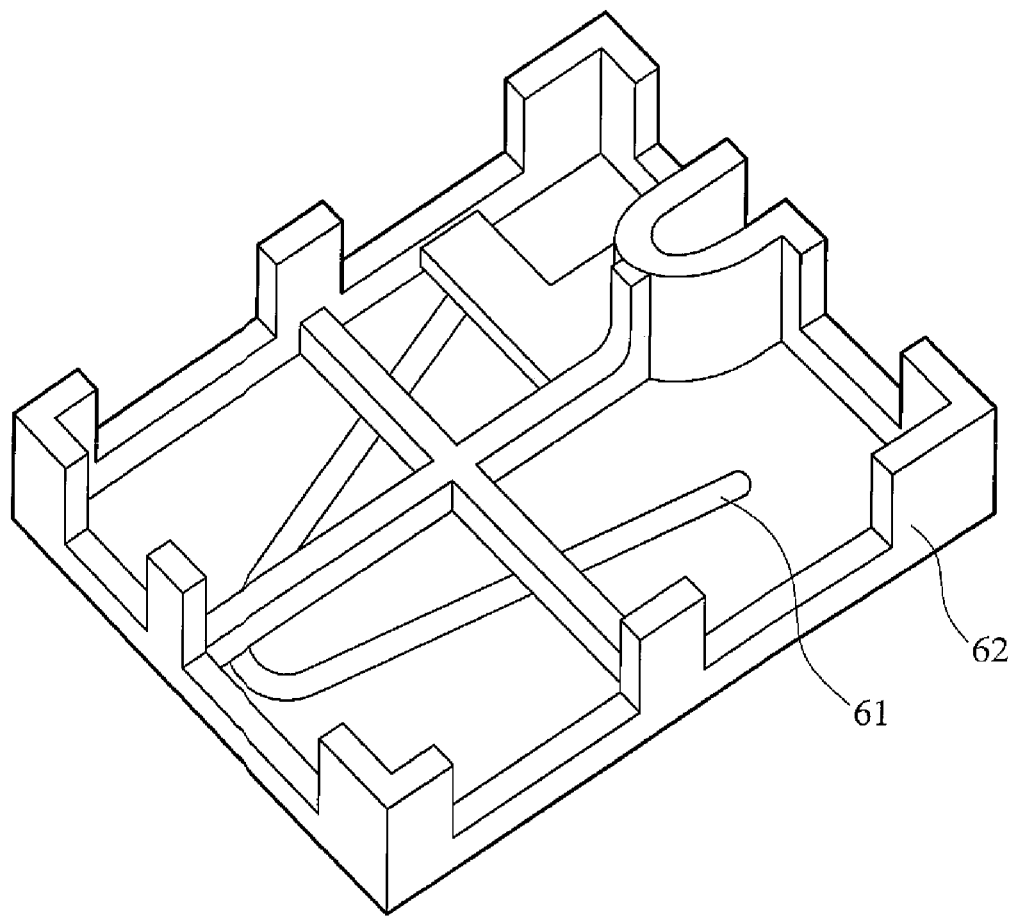
Figure 3:
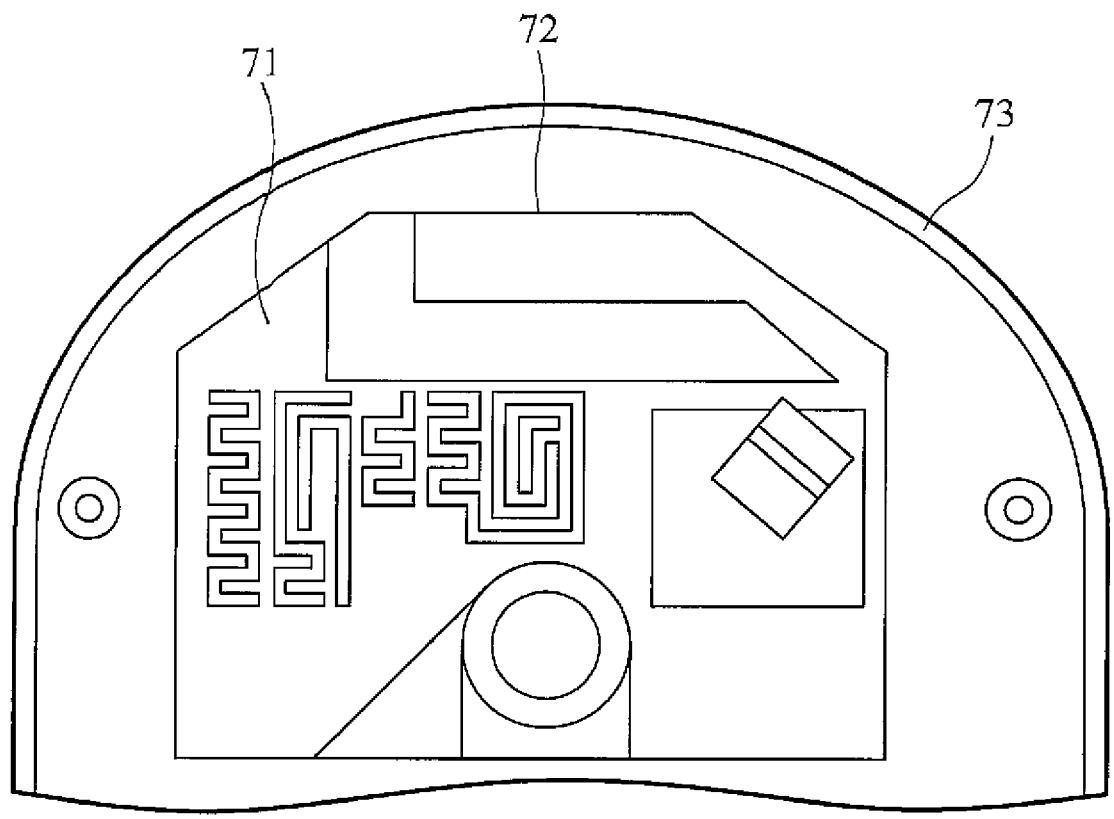
Figure 4:
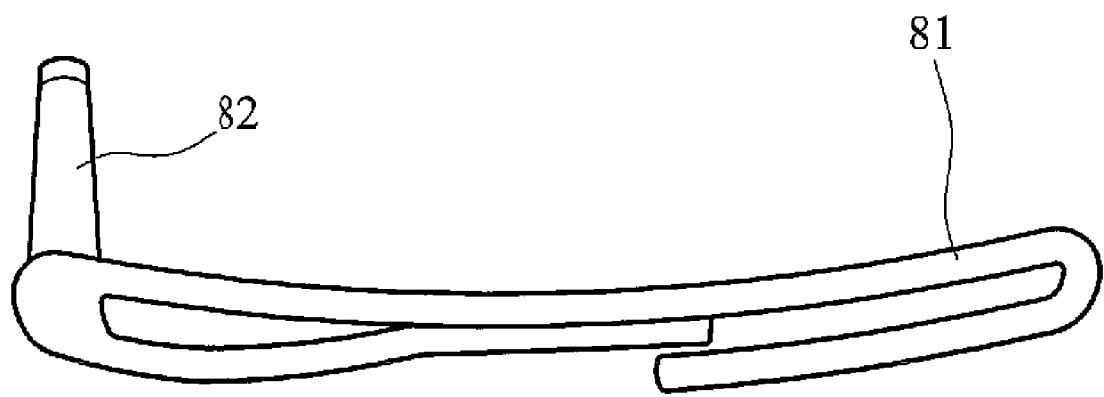
Figures 1, 5A:
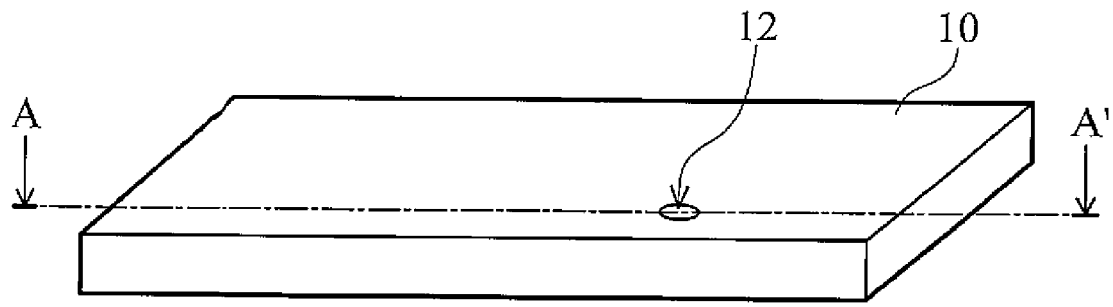
FIGS. 5a-5g show fabrication of an electronic device according to a first embodiment of the invention.
Figures 2, 5A:
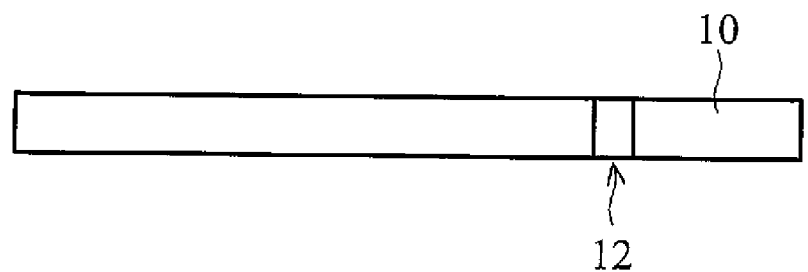

FIG. 5a-1 is a perspective view of a substrate 10 having a hole 12. The hole 12 is inside and passes through the substrate 10. The substrate 10 may be a housing of an electronic device, comprising plastic or like polymer. The electronic device may have wireless signal capability, a mobile phone or personal digital assistant (PDA). FIG. 5a-2 is a cross-section along A to A' of FIG. 5a-1.

Figure 5B:
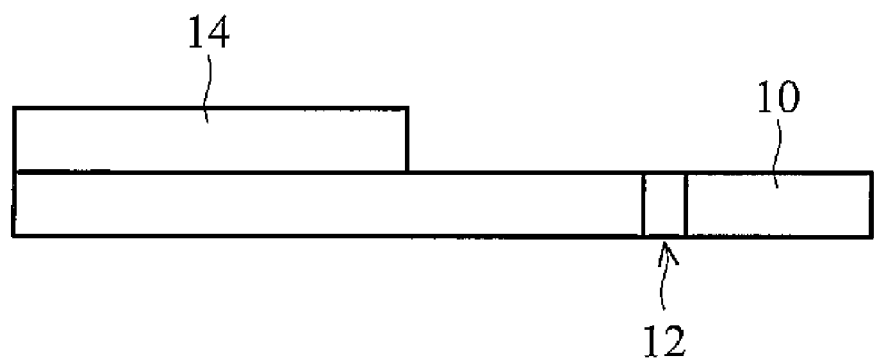

FIGS. 5b to 5g are cross-sections of fabrication of an electronic device according to the first embodiment of the invention. As shown in FIG. 5b, a covering layer 14 is formed on the substrate 10 to cover a portion thereof. The covering layer 14 may be an adhesive film, painting layer or photoresist. Preferably, the covering layer 14 comprises an adhesive film directly attached on a portion of the substrate 10 to expose the other portion of the substrate 10.

Figure 5C:
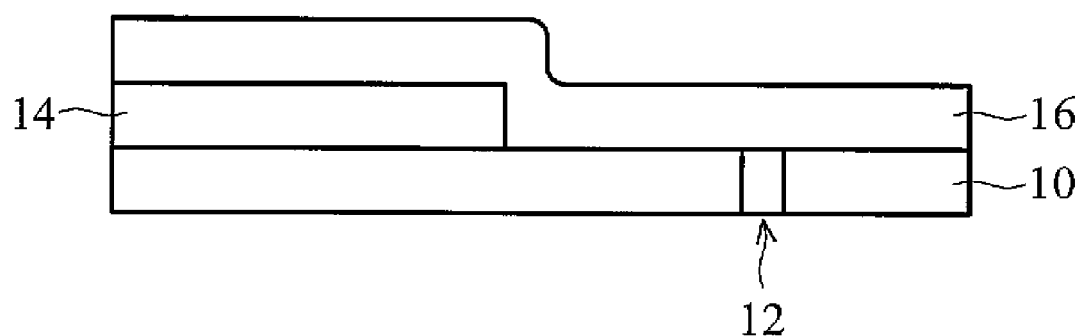

As shown in FIG. 5c, a conductive layer 16 is formed on the substrate 10, covering the covering layer 14. The conductive layer 16 may be formed by physical vapor deposition (PVD) such as vacuum evaporation, sputtering or ion plating, as well as screen printing. Preferably, the conductive layer 16 has a thickness of 5 μm to 15 μm.

Figures 1, 5D:
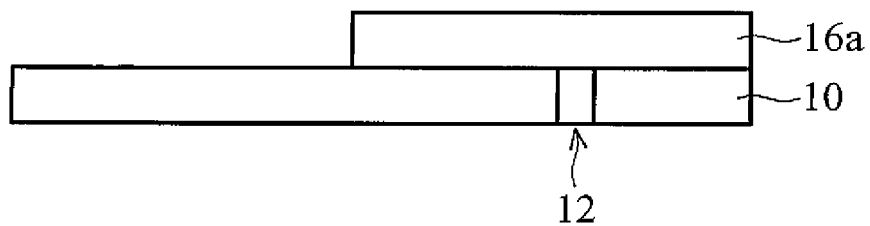
Figures 2, 5D:
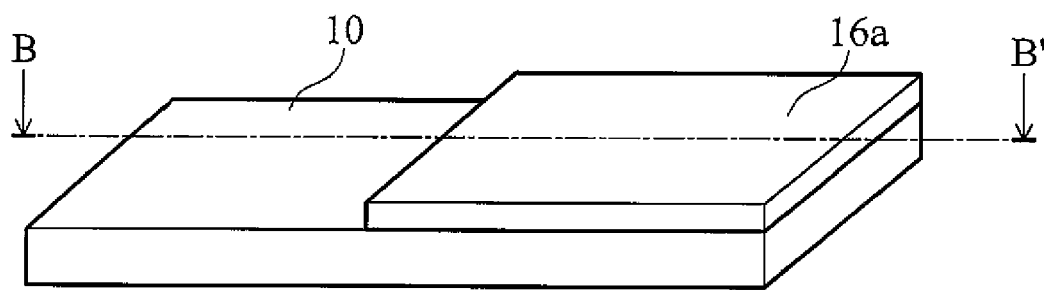

As shown in FIG. 5d-1, a cross-section along B to B' of FIG. 5d-2, the covering layer 14 and the conductive layer 16 on the covering layer 14 are removed to form a patterned conductive layer 16a, which can function as an antenna of the electronic device for sending or receiving wireless signals. As shown in FIG. 5d-2, covering layer 14 may be removed directly or using chemical solvent, depending on formation of the covering layer 14. Preferably, the covering layer 14 is an adhesive film attached to a portion of the substrate 10 or a shielding mold comprising plastic or metal. After forming the conductive layer 16, the adhesive film or the shielding mold is then directly removed to form the patterned conductive layer 16a. Dimensions of the patterned conductive layer 16a depend on the range of signals sent or received, and thus is not limited here. Preferably, the patterned conductive layer 16a has a resistance of about 0.1Ω to 20 Ω.

Figure 5E:
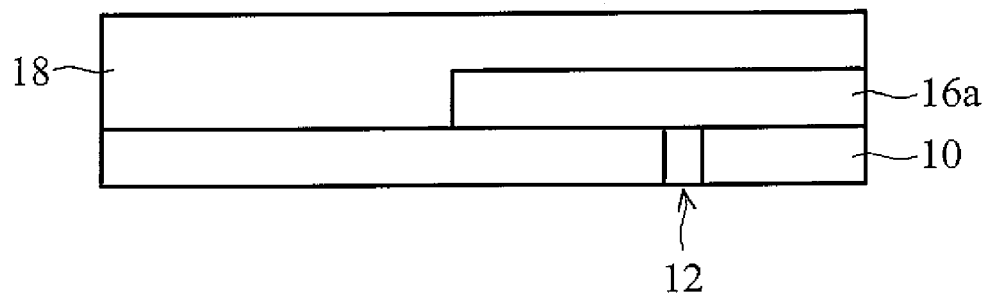

As shown FIG. 5e, a color layer 18 is then formed on the substrate 10, covering the patterned conductive layer 16a, by spread painting, bake painting, coating or other methods known in the art. Before forming the color layer 18, a sub-color layer (not shown) can optionally be formed on the substrate 10 to cover surface defects thereof. Thereafter, the color layer 18 is formed on the sub-color layer. The color layer 18 may serve a cosmetic function for the electronic device. Preferably, the color layer 18 has a thickness of about 10 μm to 20 μm.

Figure 5F:
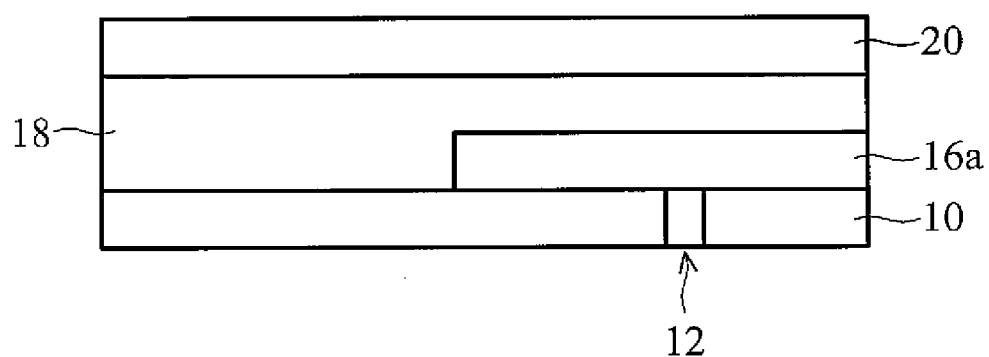

As shown in FIG. 5f, a protective layer 20 is then formed on the color layer 18. The protective layer 20 may be ultraviolet cured coat or polyurethane. The protective layer 20 may be used to protect the color layer 18 and the patterned conductive layer 16a and avoid stripping or damage to the patterned conductive layer 16a. An antifriction compound may be added into the protective layer 20 to enhance friction-resistance of the electronic device. Preferably, the protective layer 20 has a thickness of about 5 μm to 20 μm.

Figure 5G:
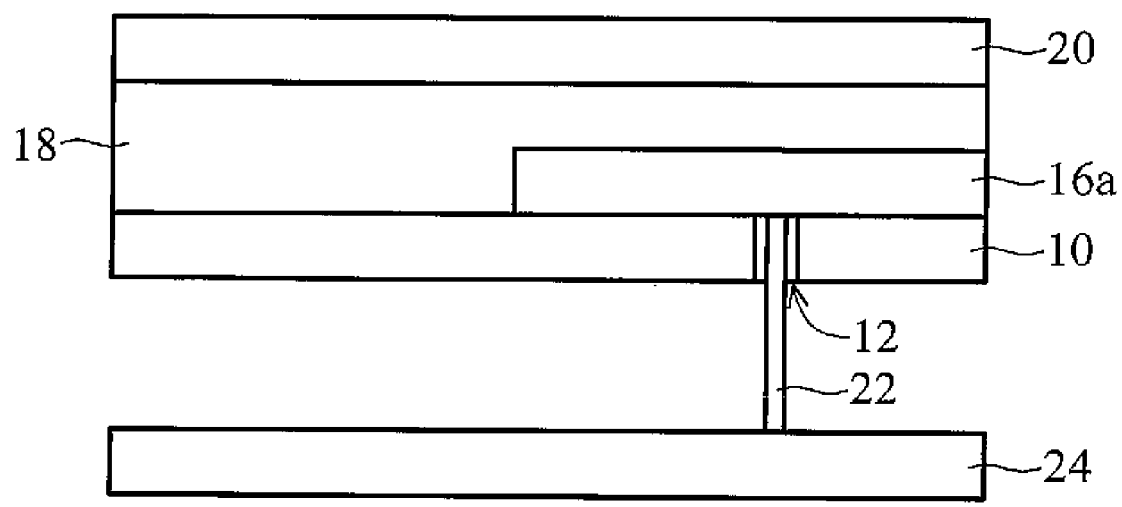

Referring to FIG. 5g, a connective piece 22 though the hole 12 inside the substrate 10 electrically connects the patterned layer 16a to a control circuit 24 for translating wireless signal. Preferably, the substrate 10 is placed between the patterned conductive layer 16a and the control circuit 24. The connective piece 22 may consist of metal or any known conductive material. The connective piece 22 may combine with the substrate 10 by insert molding injection. The patterned conductive layer 16a may serve as an antenna layer of electronic device. In received model, while an outer wireless signal is received by the antenna layer, then translated to the control circuit 24 by the connective piece 22. In sent model, before a wireless signal is sent by the electronic device, the wireless signal translated from control circuit 24 to the antenna layer by connective piece 22.

Figure 6A:
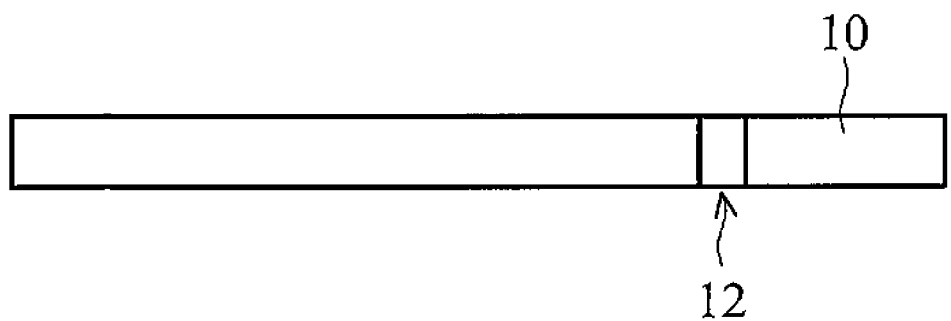
FIGS. 6a-6f show fabrication of an electronic device according to a second embodiment of invention.

FIGS. 6a to 6f are cross-sections of fabrication of an electronic device according to the second embodiment of the invention. In FIG. 6a, a substrate 10 having a hole therein is provided. The substrate 10 may consist of polymer or like compound. The substrate 10 may be a housing of an electronic device having wireless capability, such as mobile phone or personal digital assistant (PDA).

Figure 6B:
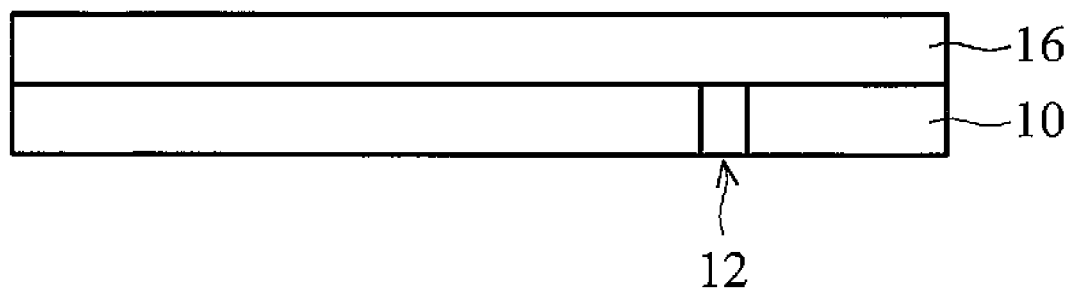

In FIG. 6b, a conductive layer 16 is formed on the substrate 10 by physical vapor deposition (PVD) such as vacuum evaporation, sputtering or ion plating, as well as screen printing. Preferably, the conductive layer 16 has a thickness between 5 μm to 15 μm.

Figure 6C:
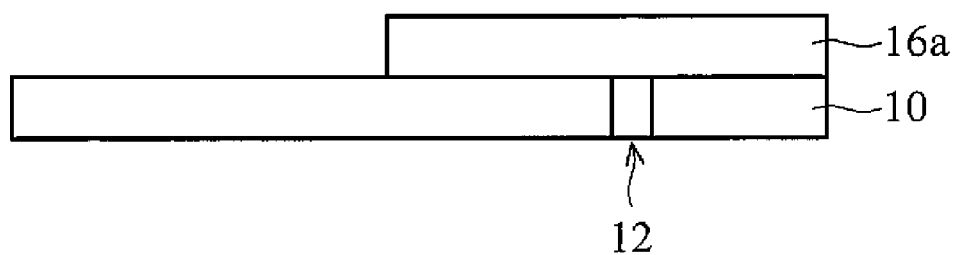

Thereafter, a portion of the conductive layer 16 is removed by laser carving to form a patterned conductive layer 16a, as shown FIG. 6c. Preferably, the patterned conductive layer 16a may serve as an antenna of the electronic device for sending or receiving wireless signals. Dimensions of the patterned conductive layer 16a depend on the range of wireless signals, and thus are not limited here. Preferably, the patterned conductive layer 16a has a resistance of about 0.1Ω to 20Ω. A precise patterned conductive layer 16a may be formed by laser carving, so that inner space of electronic device is effectively utilized.

Figure 6D:
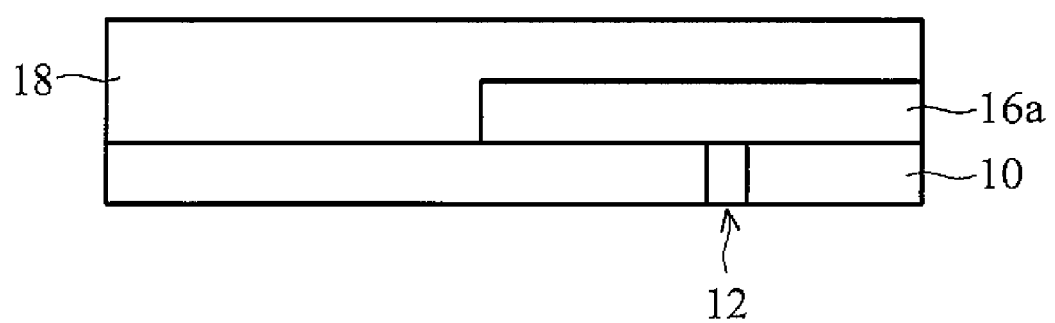

Referring to FIG. 6d, a color layer 18 is then formed on the substrate 10, covering the patterned conductive layer 16a by spread painting, bake painting, coating or other methods known in the art. Before forming the color layer 18, a sub-color layer (not shown) can optionally be formed on the substrate 10 to cover surface defects thereof. Thereafter, the color layer 18 is formed on the sub-color layer. The color layer 18 may serve a cosmetic function for the electronic device. Preferably, the color layer 18 has a thickness of about 10 μm to 20 μm.

Figure 6E:
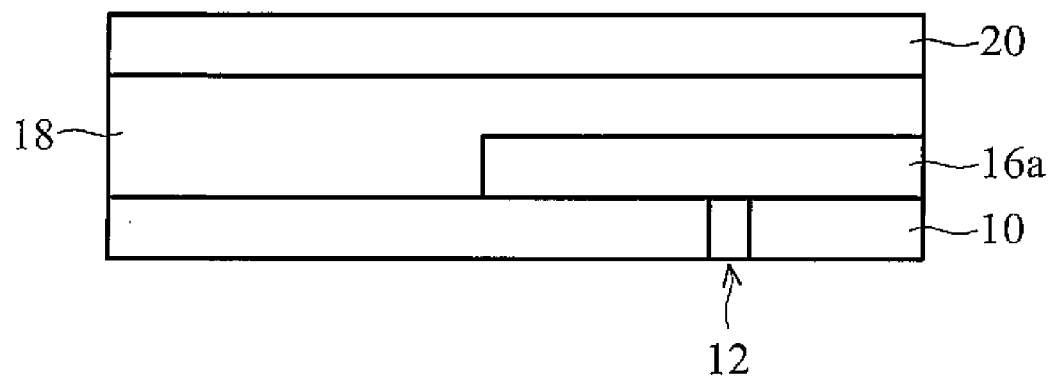

In FIG. 6e, a protective layer 20 comprising ultraviolet cured coat or polyurethane is then formed on the color layer 18. The protective layer 20 may be used to protect the color layer 18 and the patterned conductive layer 16a, to avoid stripping or damage thereto. Furthermore, an antifriction compound may be added into the protective layer 20 to enhance friction-resistance of the electronic device. Preferably, the protective layer 20 has a thickness of about 5 μm to 20 μm.

Figure 6F:
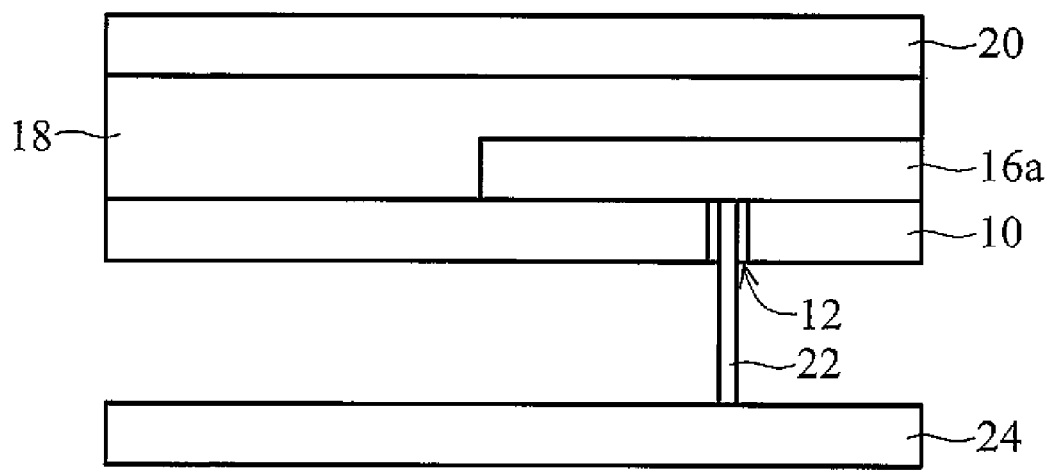

Referring to FIG. 6f, a connective piece 22 though the hole 12 inside the substrate 10 is provided to electrically connect the patterned layer 16a to a control circuit 24 for translating wireless signals. Preferably, the substrate 10 is placed between the patterned conductive layer 16a and the control circuit 24. The connective piece 22 may consist of metal or other known conductive material. The connective piece 22 may combine with the substrate 10 by insert molding injection. The patterned conductive layer 16a may serve as an antenna layer of the electronic device. In received model, while an outer wireless signal is received by the antenna layer, then translated to the control circuit 24 by the connective piece 22. In sent model, before a wireless signal is sent by the antenna layer of the electronic device, the wireless signal translated from control circuit 24 to the antenna layer by connective piece 22.

Figure 7:
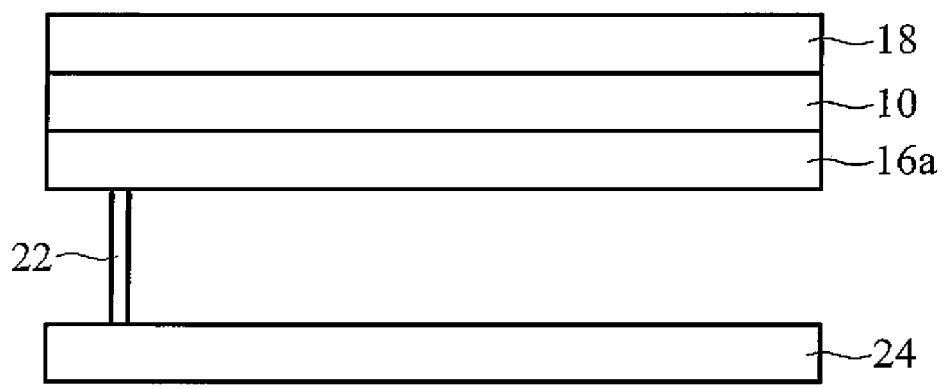
FIG. 7 is a cross-section of an electronic device having a patterned conductive layer according to a third embodiment of the invention.

FIG. 7 is a cross-section of an electronic device according to a third embodiment of the invention. In FIG. 7, a color layer 18 and a patterned conductive layer 16a are formed on surfaces of a substrate 10, respectively. Formations and compositions of the color layer 18 and the patterned conductive layer 16a identical to those disclosed in previous embodiments are not discussed here, for brevity. A control circuit 24 is correspondingly placed on the same side of the patterned conductive layer 16a. Thereafter, a connective piece 22 is provided to directly connect to control circuit 24 and the patterned conductive layer 16a. In this embodiment, the patterned conductive layer 16a may be serving as an antenna layer. In received model, while an outer wireless signal is received by the antenna layer, then translated to the control circuit 24 by the connective piece 22. In sent model, a signal translated from control circuit 24 to the antenna layer by connective piece 22 for sending a wireless signal by the antenna layer.

Figure 8:
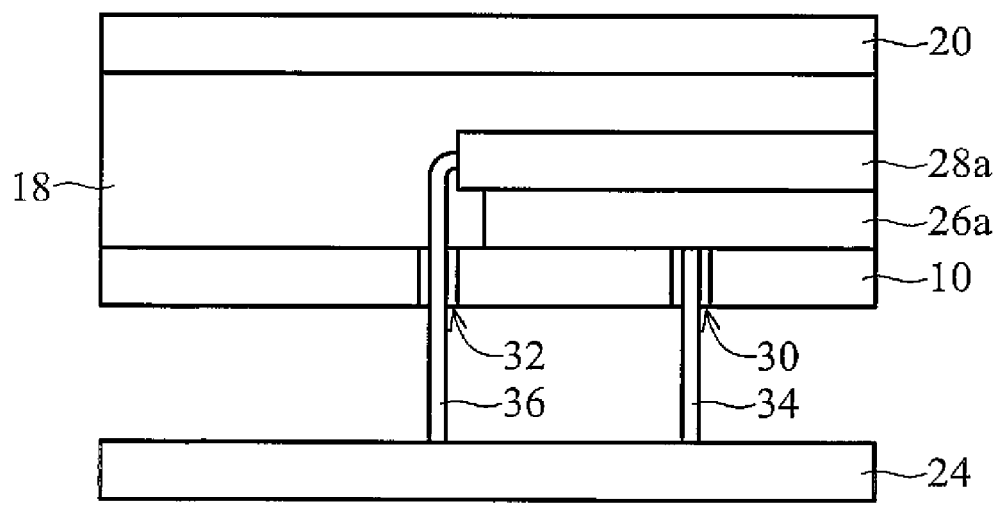
FIG. 8 is a cross-section of fabrication of an electronic device having a multi-patterned conductive layer according to a fourth embodiment of the invention.

FIG. 8 is a cross-section of an electronic device according to a fourth embodiment of the invention. A substrate 10 having a first hole 30 and a second hole 32 passing therethrough is provided. A first patterned conductive layer 26a and a second patterned conductive layer 28a are formed on the substrate 10 in sequence as disclosed previously. Dimension and shape of the first conductive layer 26a may differ from one of the second conductive layer 28a to send or receive various wavelength or frequency of wireless signal in the electronic device.

A color layer 18 and a protective layer 20 are then formed on the substrate 10 in sequence covering the first patterned conductive layer 26a and the second patterned conductive layer 28a. Formations and compositions of the color layer 18 and the protective layer 20 identical to those disclosed in previous embodiments are not discussed here, for brevity.

In FIG. 8, a first connective piece 34 though the hole 30 in the substrate 10 electrically connects the first patterned layer 26a. A second connective piece 36 through the hole 32 in the substrate 10, is provided to electrically connect the second patterned layer 28a. The first wireless signal such as communication signal through the first connective piece 34 is of a different wavelength than the second wireless signal such as network signal through the second connective piece 36. The number of holes and connection of connective pieces are disclosed here as an example, but are not limited thereto.

Figure 9:
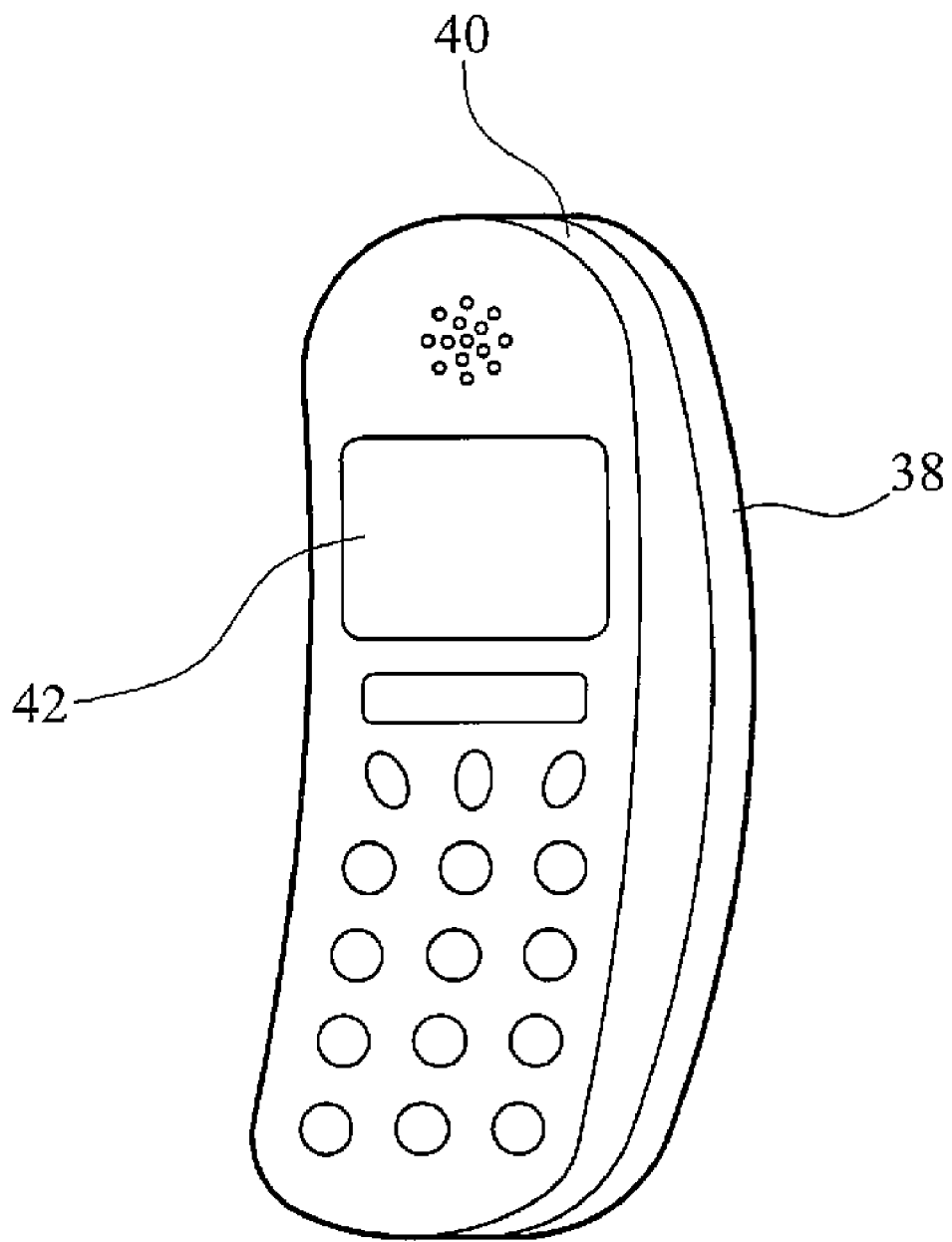
FIG. 9 is a schematic view of a mobile phone according to an application of the invention.

FIG. 9 shows a mobile phone according to further embodiment of the invention. A lower housing 38 is associated with an upper housing 40, as shown in FIG. 9. A screen 42 is further provided to show state of mobile phone. A patterned conductive layer (not shown) may be disposed outside or inside of the lower housing 38 to send or receive wireless signal.

Figure 10:
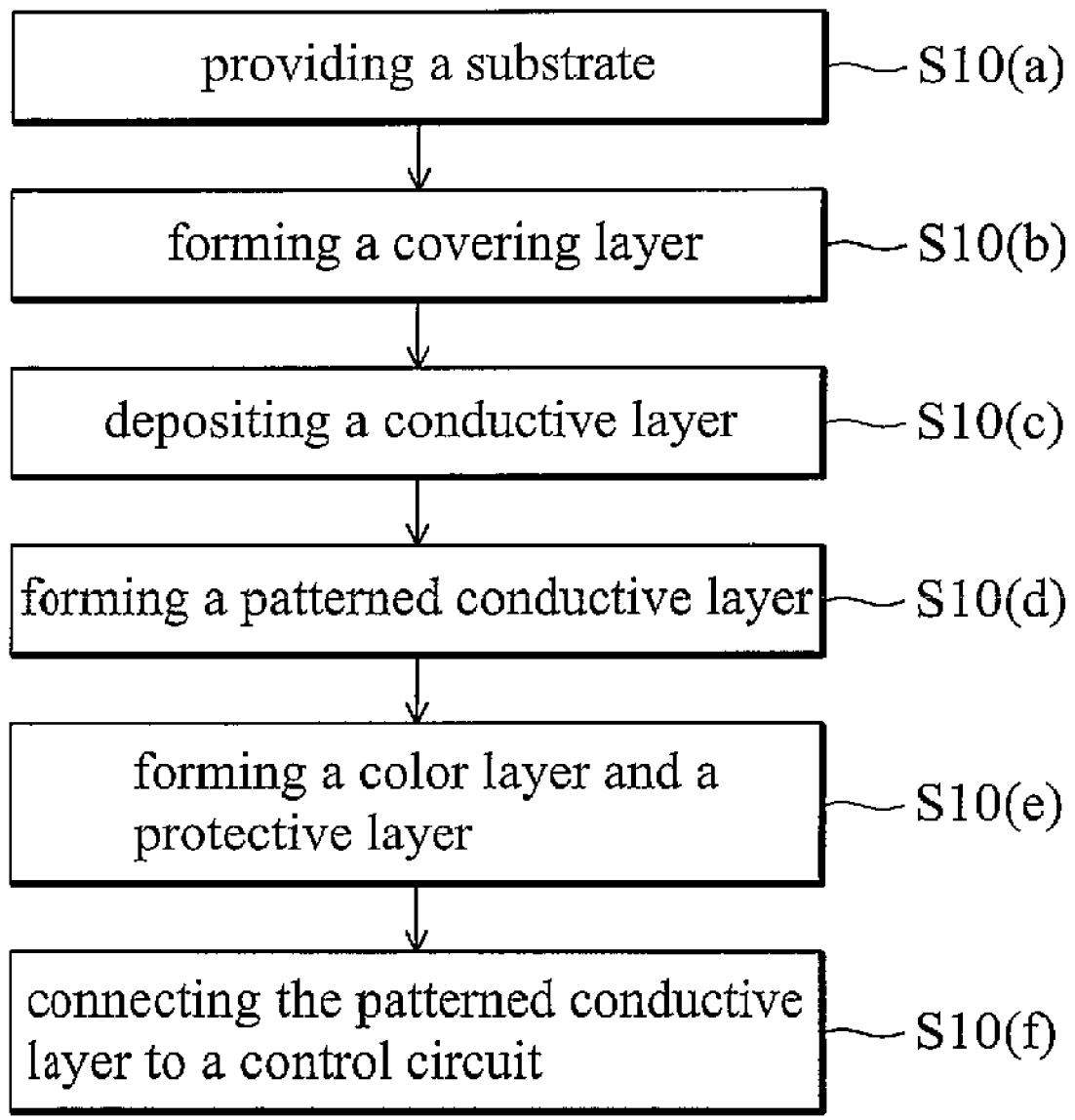
FIG. 10 is a flowchart of fabrication of an electronic device according to a first embodiment of the invention.

FIG. 10 is a flowchart of fabrication of an electronic device according to first embodiment of the invention. A substrate is provided, as step S10(*a*). A covering layer is formed on a portion of the substrate, as step S10(*b*). A conductive layer is formed on the substrate and covering the covering layer by physical vapor deposition (PVD), as step S10(*c*). A patterned conductive layer is formed by removing the covering layer, as step S10(*d*). A color layer and protective layer are then formed on the patterned conductive layer in sequence, as step S10(*e*). A connective piece is provided to connect with the patterned conductive layer and a control circuit for sending or receiving wireless signal, as step S10(*f*).

Figure 11:
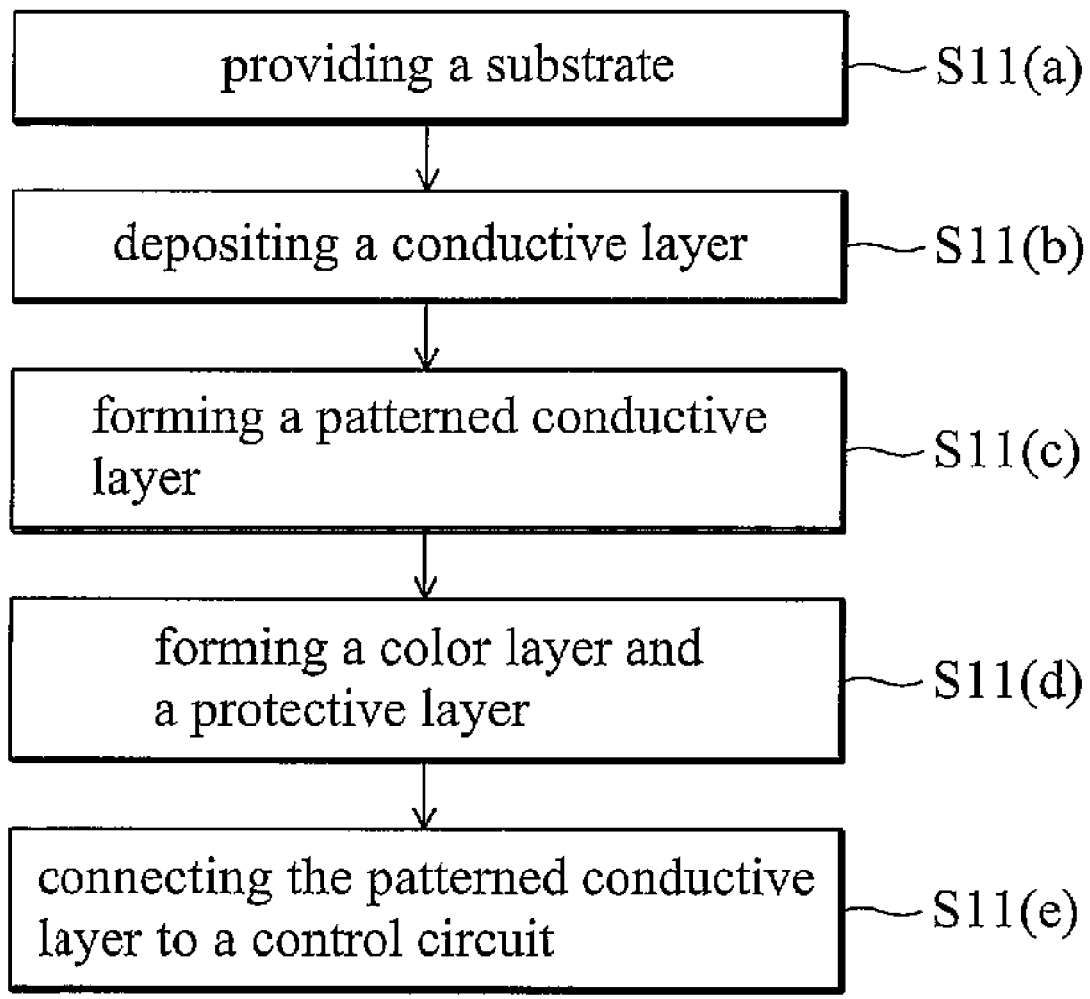
FIG. 11 is a flowchart of fabrication of an electronic device according to a second embodiment of the invention.

FIG. 11 is a flowchart of fabrication of an electronic device according to second embodiment of the invention. A substrate is provided, as step S11(*a*). A conductive layer is formed on the substrate by physical vapor deposition (PVD), as step S11(*b*). A patterned conductive layer is formed by laser carving, as step S11(*c*). A color layer and protective layer are then formed on the patterned conductive layer in sequence, as step S11(*d*). A connective piece is provided to connect with the patterned conductive layer and a control circuit for sending or receiving wireless signal, as step S11(*e*).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
    a housing; and
    a patterned conductive layer formed on an outer surface of the housing and electrically connected to a control circuit to send or receive wireless signals, wherein the housing is between the patterned conductive layer and the control circuit;
    wherein the patterned conductive layer is formed by physical vapor deposition or screen printing.

2. The electronic device of claim 1, wherein the housing comprises a polymer.

3. The electronic device of claim 1, further comprising:
    a protective layer formed on the patterned conductive layer; and
    a color layer formed between the patterned conductive layer and the protective layer.

4. The electronic device of claim 3, wherein the protective layer comprises a ultraviolet curved coat or polyurethane.

5. The electronic device of claim 1, further comprising a connective piece and the substrate having a hole therethough, the patterned conductive layer electrically connected to the control circuit by the connective piece through the hole.

6. The electronic device of claim 5, wherein the connective piece comprises metal.

7. The electronic device of claim 1, wherein the patterned conductive layer comprises a formation of multilayer to send or receive various wavelength or frequency of the wireless signal.

8. The electronic device of claim 1, wherein the patterned conductive layer has a resistance of about $0.1\Omega\sim20\Omega$.

* * * * *